United States Patent [19]

Mattox et al.

[11] Patent Number: 5,217,920

[45] Date of Patent: Jun. 8, 1993

[54] METHOD OF FORMING SUBSTRATE CONTACT TRENCHES AND ISOLATION TRENCHES USING ANODIZATION FOR ISOLATION

[75] Inventors: Robert J. Mattox, Tempe; Paul R. Proctor; Syd R. Wilson, both of Phoenix, all of Ariz.

[73] Assignee: Motorola, Inc., Schaumburg, Ill.

[21] Appl. No.: 900,392

[22] Filed: Jun. 18, 1992

[51] Int. Cl.⁵ ............................................. H01L 21/76
[52] U.S. Cl. ....................................... 437/67; 437/71; 437/228; 437/968; 148/DIG. 50; 148/DIG. 117
[58] Field of Search ............... 437/228, 67, 71, 61, 437/186, 968; 148/DIG. 50, DIG. 117

[56] References Cited

U.S. PATENT DOCUMENTS

| | | | |
|---|---|---|---|
| 4,016,017 | 4/1977 | Aboaf et al. | 437/71 |
| 4,745,081 | 5/1988 | Beyer et al. | 437/67 |
| 4,810,667 | 3/1989 | Zorinsky et al. | 437/72 |
| 4,849,370 | 7/1989 | Spratt et al. | 437/71 |

OTHER PUBLICATIONS

Turner, "Electropolishing Silicon in Hydrofluoric Acid Solution", Journal of the Electrochem. Soc., Jul. 1958; pp. 402–408.
Unagami, "Oxidation of Porous Silicon and Properties of its Oxides Film", Japanese Journal of Appl. Physics, vol. 19, No. 2, Feb. 1980, pp. 231–241.
Unagami et al., "Study of Injection Type IPOS Scheme", Jap. Journal of Appl. Phys., vol. 16, No. 9, Sep. 1977 pp. 1635–1640.
Labunov et al. "Investigation of Porous Silicon Formation During Anodic Treatment in Aqueous HF"; Thin Solid Films, 64 (1979) pp. 479–483.
Unagami et al., "An Isolation Technique Using Oxidized Porous Silicon", JARECT, vol. 8, Semiconductor Technologies, (1983).

Primary Examiner—Brian E. Hearn
Assistant Examiner—Trung Dang
Attorney, Agent, or Firm—Harry A. Wolin

[57] ABSTRACT

A method of fabricating a semiconductor structure includes providing a substrate having at least one layer formed thereon. At least two trenches are formed through the layer and into the substrate wherein at least one trench is for isolation and at least one trench is for making contact to the substrate. After a trench liner is formed on the sidewalls of the trenches, the trenches are filled with doped semiconductor material. The doped semiconductor material in the trench for isolation is then anodized. After the anodization, the anodized trench fill material is oxidized.

13 Claims, 3 Drawing Sheets

METHOD OF FORMING SUBSTRATE CONTACT TRENCHES AND ISOLATION TRENCHES USING ANODIZATION FOR ISOLATION

FIELD OF THE INVENTION

This invention relates, in general, to the semiconductor arts and more particularly to a semiconductor structure and method of fabrication wherein trenches for both isolation and substrate contact are formed simultaneously.

BACKGROUND OF THE INVENTION

It is known and desireable in the semiconductor arts to contact a semiconductor substrate through the top of a semiconductor structure. One such method of making substrate contact is to diffuse dopant from the top surface of the structure to the substrate. Although contact may be made in this manner, the diffusion likely spreads and consumes valuble space. Further, this method may not be utilized in a structure having a blanket buried layer.

Trench structures are also well known in the semiconductor arts and are employed for making substrate contact as well as for device and circuit isolation. Trenches employed in these manners are especially useful in high performance bipolar and BICMOS integrated circuits.

One method of forming trenches for both isolation and substrate contacts includes first etching an isolation trench, forming a trench liner on the sides and bottom of the trench and then filling the remainder of the trench with undoped polysilicon. Once this isolation trench has been completed, substrate contact trenches are etched and an oxide liner is formed on the sides and bottoms thereof. The liner is then removed from the bottom of the trench exposing the substrate. Once the substrate is exposed, the trench is filled with doped polysilicon to form a substrate contact trench. This process employs a series of masks and requires numerous process steps. This is relatively expensive and requires large amounts of time.

Another method of forming both substrate contact trenches and isolation trenches in the same structure includes simultaneously etching trenches and then filling the trenches with doped polysilicon. Although this is relatively easy to do, the structure suffers from significantly high capacitance and is therefore undesirable.

Another method of forming both substrate contact trenches and isolation trenches in a single structure includes simultaneously etching and then filling the trenches. It is then attempted to selectively dope the trench fill disposed in the substrate contact trenches without doping the trench fill disposed in the isolation trenches. This is very difficult to do and is also expensive and time consuming.

Accordingly, it would be highly desirable to have a method of fabricating a semiconductor structure where substrate contact trenches and isolation trenches could be simultaneously fabricated so that the structure has reduced capacitance, may be employed with a blanket buried layer, is relatively easy to build and is inexpensive.

SUMMARY OF THE INVENTION

A method of fabricating a semiconductor structure includes providing a semiconductor substrate having at least one layer formed thereon. At least two trenches are formed through the layer and into the substrate. At least one of the trenches is for trench isolation while at least one other of the trenches is to serve as a substrate contact trench. A trench liner is formed on the sidewalls of at least the trench for isolation. The trenches are then filled with doped semiconductor material. The doped semiconductor material is then anodized in the at least one trench that is going to be used for isolation. This anodized polysilicon is then oxidized.

DETAILED DESCRIPTION OF THE DRAWINGS

FIGS. 1-6 are highly enlarged cross-sectional views of a portion of a semiconductor structure 10 during processing. It should be understood that structure 10 is not necessarily to scale and is only exemplary of the various structures that may be fabricated in accordance with the present invention. The number and arrangement of the various trenches detailed herein may be varied depending upon the specific application for which the structure is to be used. Structures of the type of structure 10 are especially useful in fabricating high performance bipolar and BICMOS integrated circuits although structure 10 may be employed for other types of integrated circuits which require both substrate contact trenches and isolation trenches.

Figure 1:
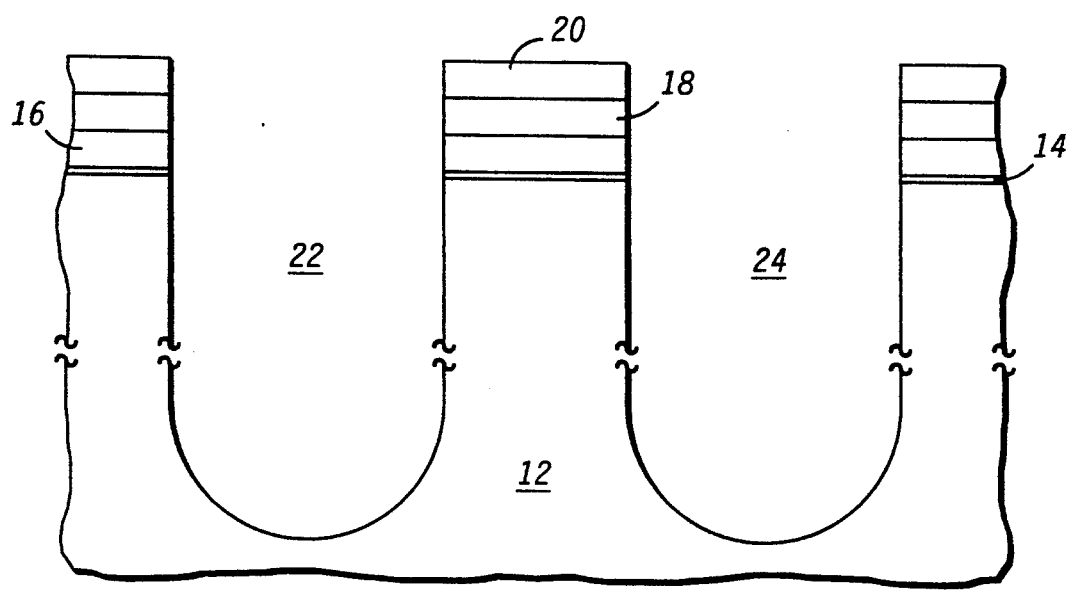
FIGS. 1-6 are highly enlarged cross-sectional views of a portion of a semiconductor structure during processing.

Now referring specifically to FIG. 1. Structure 10 includes a substrate 12. Substrate 12 comprises monocrystalline silicon as is well known in the art. It should be understood however, that substrates comprising other materials may also be employed in accordance with the present invention. A pad oxide layer 14 is disposed directly on the surface of substrate 12. Pad oxide layer is a thermally grown oxide desireably having a thickness on the order of 100 to 300 angstroms. A polysilicon layer 16 is formed on pad oxide layer 14. Polysilicon layer 16 is deposited as is well known in the art and has a thickness on the order of 350 to 700 angstroms. Both pad oxide layer 14 and polysilicon layer are formed on the entire surface of substrate 12.

A nitride layer 18 is formed on polysilicon layer 16. Nitride layer 18 is deposited as is well known in the art and has a thickness on the order of 1000 to 2500 angstroms. A hard mask layer 20 is formed on nitride layer 18. Hard mask layer 20 comprises oxide in this embodiment and is formed by plasma enhanced TEOS deposition. Hard mask layer 20 has a thickness on the order of 1000 to 5000 angstroms. It should be understood, however, that other suitable hard mask materials may be employed. Nitride layer 18 and hard mask layer 20 are both formed only over selected portions of polysilicon layer 16. Nitride layer 18 and hard mask layer 20 serve as a mask for the etching of trenches.

Following the formation of hard mask layer 20, trenches 22 and 24 are formed by reactive ion etching. Trenches 22 and 24 extend through polysilicon layer 16, pad oxide layer 14 and into substrate 12. Preferably, trenches 22 and 24 extend into substrate 12 at least 4 micrometers and most preferably, trenches 22 and 24 extend on the order of 5 to 6 micrometers into substrate 12. As shown herein, trench 22 will serve as an isolation trench while trench 24 will serve as a substrate contact trench.

Figure 2:
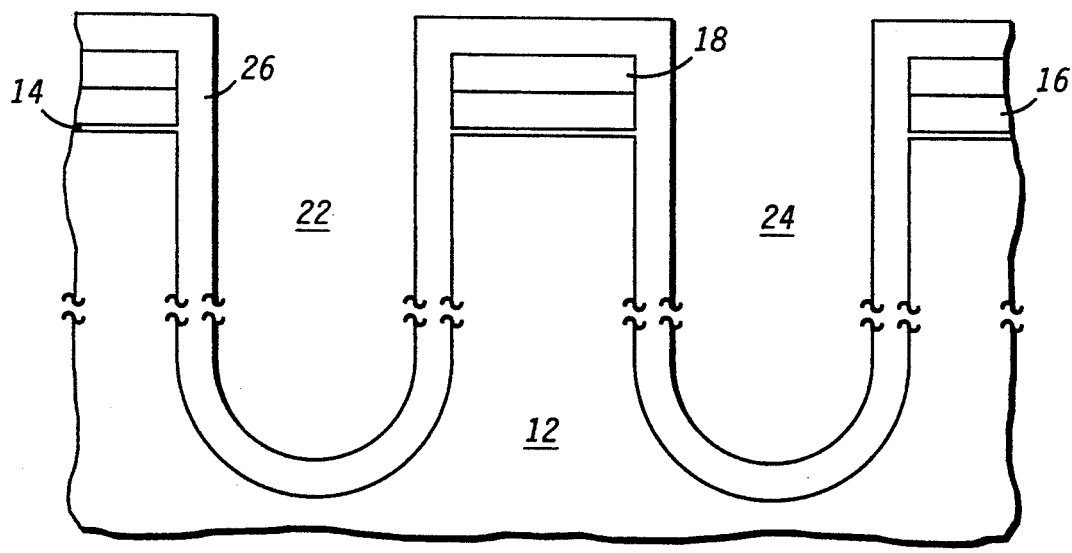

Now referring to FIG. 2. Following the removal of hard mask layer 20 by methods known in the art, a trench liner 26 is formed in trenches 22 and 24. Trench liner is formed by thermally oxidizing a thickness on the order of 200 to 1,000 angstroms and preferably on the order of 400 angstroms. A chemical vapor deposited oxide is then formed on the thermally grown oxide. The deposited oxide portion of trench liner 26 has a thickness on the order of 1,500 to 4,000 angstroms and preferably on the order of 2,000 angstroms. In a most preferable embodiment, trench liner 26 formed above nitride layer 18 will have a thickness on the order of 2,600 angstroms, trench liner 26 formed on the sidewalls of trenches 22 and 24 will have a thickness of approximately 2,000 angstroms and trench liner 26 disposed on the bottom of trenches 22 and 24 will have a thickness on the order of 1,600 to 1,800 angstroms. Although it is preferred that trench liner 26 be formed in both trenches 22 and 24, the present invention is feasible if trench liner 26 is formed only trench 22 for isolation and not in trench 24 for substrate contact.

Figure 3:
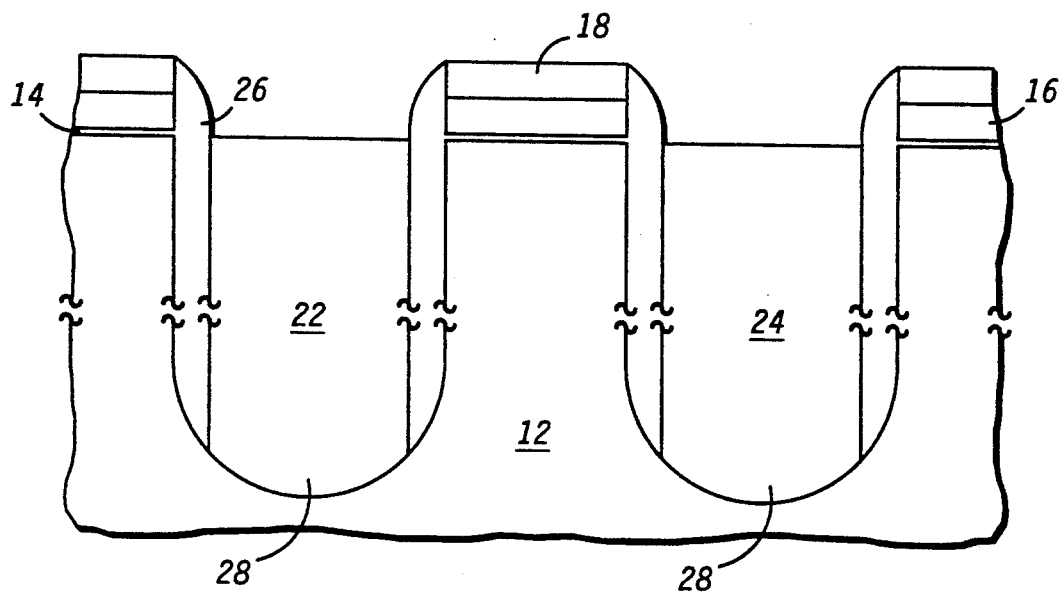

Referring specifically to FIG. 3. Following the formation of trench liner 26 as shown in FIG. 2, the portion of trench liner 26 disposed on the bottom of trenches 22 and 24 as well as the portion of trench liner 26 disposed on nitride layer 18 are removed. The removal of these portions of trench liner 26 is performed by reactive ion etching and is well known in the art. Following this etch, trench liner 26 remains only on the sidewalls of trenches 22 and 24. This exposes substrate 12 in the bottom of trenches 22 and 24.

Once substrate 12 has been exposed in trenches 22 and 24, trenches 22 and 24 are filled with trench fill material 28. As shown herein, trench fill material comprises doped polysilicon. In a preferred embodiment, polysilicon trench fill material 28 is in situ doped and has a P conductivity type. It is desirable that the dopant concentration be on the order of $10^{16}$ to $10^{20}$ cm$^{-3}$. A dopant concentration on the order of $10^{19}$ cm$^{-3}$ is most preferred. Trench fill material 28 is generally formed on the surface of structure 10 as well as in trenches 22 and 24. Therefore, trench fill material 28 must be planarized in trenches 22 and 24 following its deposition. Preferably, trench fill material 28 will be slightly recessed in trenches 22 and 24 following planarization.

Figure 4:
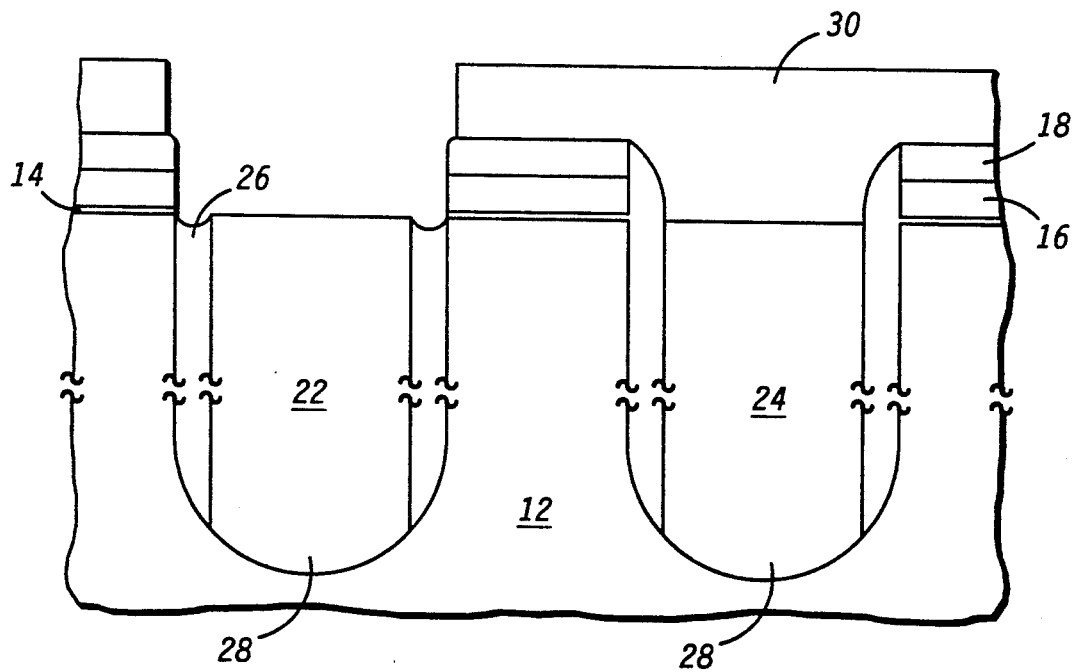

Now referring specifically to FIG. 4. Following the formation of trench fill material 28 in trenches 22 and 24, a mask 30 is formed on the surface of structure 10. Mask 30 may be a photoresist mask or of another material well known in the art. Mask 30 covers substrate contact trench 24 while leaving isolation trench 22 exposed.

Once mask 30 has been formed, trench fill material 28 disposed in isolation trench 22 is anodized. The anodization of trench fill material 28 in isolation trench 22 preferably utilizes an open-bath style anodization cell with direct contact of the anode electrolyte to the backside of substrate 12. It may be desirable to implant the backside of substrate 12 to improve ohmic contact with the electrolyte solution. Further, the open-bath style cell includes the cathode electrolyte directly contacting the frontside of substrate 12. Preferably an HF based electrolyte solution is employed. A 15% by weight HF in water solution is desirable. The anodization cell and electrolyte employed for this anodization are of types well known in the art and it should be understood that anodization cells of other designs and other electrolytes may be employed. The electrolyte concentration, current density and anodization time may all be varied as desired.

During the anodization of trench fill material 28 in isolation trench 22, not only will trench fill material 28 be anodized but trench liner 26 and nitride layer 18 will be etched to a slight extent. The anodization of polysilicon trench fill 28 causes it to become extremely porous. Basically, the goal of such an anodization is to remove 50% to 60% of trench fill material 28 from isolation trench 22. The removal of this material causes minimal volume expansion to occur during future oxidizing steps. This, in turn, will cause minimal stress on substrate 12. Oxide liner 26 will act as a stress relief buffer to volume expansion. The volume expansion may be controlled by varying the electrolyte concentration, current density and anodization time to effect the resulting percent porosity of polysilicon trench fill material 28.

Figure 5:
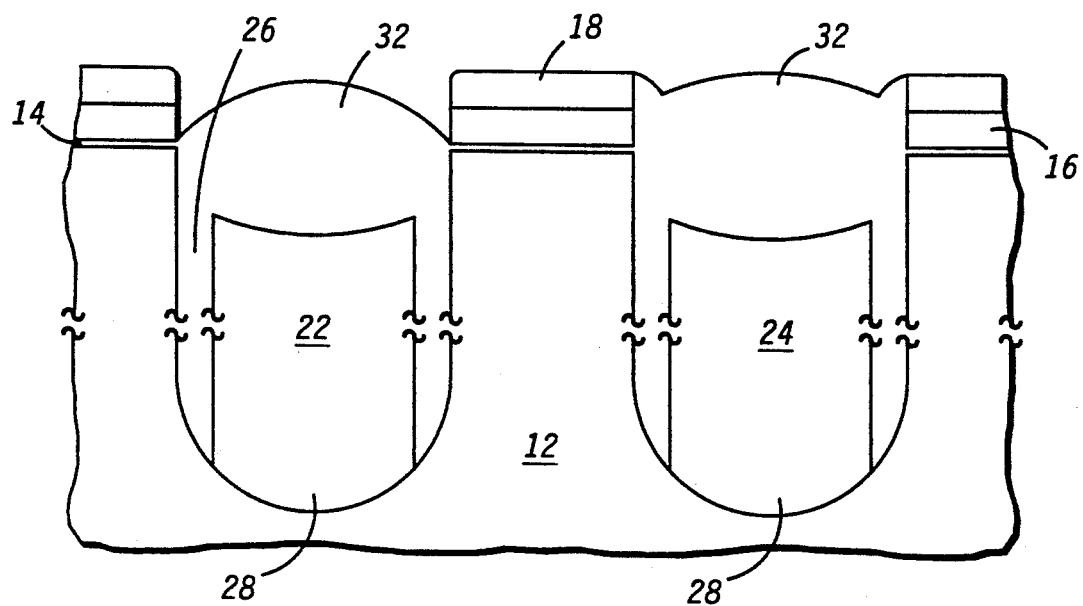

Now referring specifically to FIG. 5. Following the anodization of trench fill material 28 in isolation trench 22, mask 30 is removed. The removal of a photoresist mask such as mask 30 is well known in the art. Following the removal of mask 30, anodized trench fill 28 is oxidized in isolation trench 22. The anodized material 28 will oxidize on the order of 100 to 200 times quicker than non-anodized polysilicon. Further, the oxidation of anodized polysilicon requires only heat and not an oxidizing atmosphere although an oxidizing atmosphere may be employed. A heat of greater than 1,000° C. is sufficient to oxidize anodized polysilicon.

Figure 6:
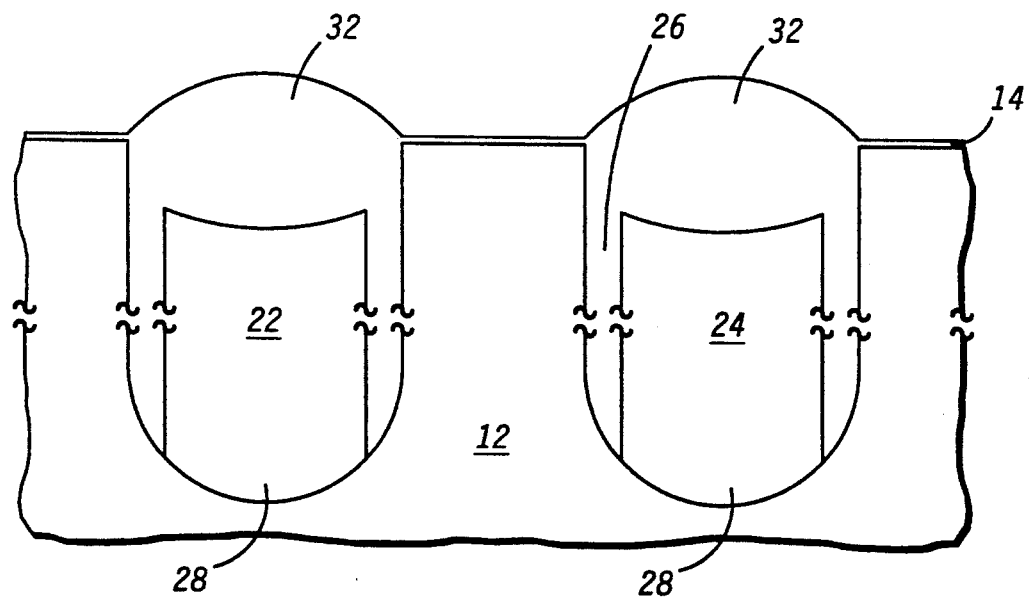

Following the oxidation of anodized trench fill 28, field oxidation regions 32 are formed over trenches 22 and 24. Field oxidation regions are formed by thermal oxidation as is well known in the art. Following the formation of field oxidation regions 32, nitride layer 18 and polysilicon layer 16 are removed from structure 10. This is depicted by FIG. 6. Following the removal of nitride layer 18 and polysilicon layer 16, structure 10 is ready to have device processing begin.

The process and structure described herein is especially useful when substrate contact trenches and isolation trenches are each desired and real estate is at a premium. The method described is applicable to very scaled-down structures. Further, this method is extremely useful with blanket type layers such as buried layers and others. Since the sidewalls of substrate contact trench 24 are lined with oxide liner 26, trench 24 may extend directly through a blanket buried layer. A structure would therefore not require the additional mask steps of forming patterned buried layers. This method and structure is also ideal for bonded wafer structures because trenches 22 and 24 may extend through bonding interfaces, buried layers, or insulator layers disposed between substrates.

Thus it is apparent that there has been provided, in accordance with the invention, an improved semiconductor method and structure. While specific embodiments of the invention have been shown and described, modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method of fabricating a semiconductor structure comprising the steps of:

providing a semiconductor substrate having at least one layer formed thereon;

forming at least two trenches through said layer and into said substrate wherein at least one trench is for isolation and at least one trench is for making contact to said substrate;

forming a trench liner on sidewalls of said at least one trench for isolation;

filling said trenches with doped semiconductor material;

anodizing said doped semiconductor material in said at least one trench for isolation; and oxidizing said anodized doped semiconductor material.

2. The method of claim 1 wherein the providing step includes providing a silicon substrate having an oxide layer formed thereon, a polysilicon layer formed on said oxide layer and a nitride layer formed on said polysilicon layer.

3. The method of claim 1 wherein the forming a trench liner step includes forming an oxide trench liner.

4. The method of claim 3 wherein the forming a trench liner step includes forming a trench liner in said trenches for substrate contact.

5. The method of claim 1 wherein the filling step includes filling the trenches with in situ doped polysilicon.

6. The method of claim 5 wherein the filling step includes filling the trenches with in situ doped polysilicon having a P conductivity type.

7. The method of claim 6 wherein the filling step includes filling the trenches with in situ doped polysilicon having a P conductivity type and a dopant concentration on the order of $10^{16}$ to $10^{20}$ cm$^{-3}$.

8. In fabricating a semiconductor structure, a method of simultaneously forming substrate contact trenches and isolation trenches comprising the steps of:

providing a silicon substrate having a plurality of layers disposed thereon;

etching a plurality of trenches through said plurality of layers and into said substrate;

forming an oxide liner on sidewalls of said plurality of trenches while leaving said substrate exposed on the bottom of said trenches;

forming doped polysilicon in said trenches;

anodizing said doped polysilicon in said trenches to be used as isolation trenches; and oxidizing said anodized doped polysilicon.

9. The method of claim 8 wherein the providing step includes providing a silicon substrate having an oxide layer formed thereon, a polysilicon layer formed on said oxide layer and a nitride layer formed on said polysilicon layer.

10. The method of claim 8 wherein the etching step includes etching a plurality of trenches having a depth into the substrate of 4 micrometers or more.

11. The method of claim 8 wherein the forming doped polysilicon step includes forming in situ doped P-type polysilicon in the trenches.

12. The method of claim 11 wherein the forming doped polysilicon step includes forming in situ doped P-type polysilicon having a dopant concentration on the order of $10^{16}$ to $10^{20}$ cm$^{-3}$ in the trenches.

13. The method of claim 8 further including the step of forming a mask on trenches to be used for substrate contacts prior to the anodizing step.

* * * * *